US012635074B2

(12) United States Patent
Tung et al.

(10) Patent No.: US 12,635,074 B2
(45) Date of Patent: May 19, 2026

(54) BOND PAD CONNECTOR FOR SECURING AN ELECTRONIC COMPONENT THEREON

(71) Applicant: Jabil Inc., St. Petersburg, FL (US)

(72) Inventors: Lun Hao Tung, Butterworth (MY); Lai Ming Lim, Bukit Mertajam (MY); Zambri Samsudin, Gelugor (MY)

(73) Assignee: Jabil Inc., St. Petersburg, FL (US)

( * ) Notice: Subject to any disclaimer, the term of this patent is extended or adjusted under 35 U.S.C. 154(b) by 272 days.

(21) Appl. No.: 18/355,167

(22) Filed: Jul. 19, 2023

(65) Prior Publication Data

US 2024/0098895 A1 Mar. 21, 2024

(30) Foreign Application Priority Data

Sep. 21, 2022 (MY) ................................ 2022005148

(51) Int. Cl.
H05K 1/11 (2006.01)
H05K 1/02 (2006.01)
H05K 1/181 (2026.01)

(52) U.S. Cl.
CPC ........... H05K 1/111 (2013.01); H05K 1/0283 (2013.01); H05K 1/181 (2013.01); *H05K 2201/09236* (2013.01); *H05K 2201/0939* (2013.01)

(58) Field of Classification Search
CPC ...... H05K 1/111; H05K 1/0283; H05K 1/181; H05K 2201/09236; H05K 2201/0939; H05K 3/321; H05K 2201/09381; H05K 2201/09445; H05K 1/189
USPC ........................................................ 174/261
See application file for complete search history.

(56) References Cited

U.S. PATENT DOCUMENTS

| | | | |
|---|---|---|---|
| H921 H * | 5/1991 | Wannemacher, Jr. ...................... | H05K 1/111 |
| | | | 361/767 |
| 6,743,982 B2 * | 6/2004 | Biegelsen ........... | H01L 25/0655 |
| | | | 257/E23.177 |
| 6,844,504 B2 * | 1/2005 | Wang ...................... | H05K 3/44 |
| | | | 174/262 |

(Continued)

FOREIGN PATENT DOCUMENTS

| | | |
|---|---|---|
| DE | 69504301 T2 | 5/1999 |
| DE | 19860716 C1 | 9/2000 |

OTHER PUBLICATIONS

Search Report issued to European counterpart application No. 23193322.7 by the EPO on Feb. 19, 2024.

*Primary Examiner* — Timothy J Thompson
(74) *Attorney, Agent, or Firm* — Young Basile Hanlon & MacFarlane, P.C.

(57) ABSTRACT

A bond pad connector to be disposed on a stretchable substrate and adapted to secure an electronic component thereon. The bond pad connector includes two spaced apart bond pads that are adapted to be disposed on the stretchable substrate to face each other. Each of the two bond pads is adapted to be connected to a respective conductive trace and includes: a stress relieve component that is adapted to be connected to the conductive trace, the stress relieve component being formed with a central hole; and an extension component extending from the stress relieve component and opposite to the conductive trace. The electronic component is secured onto the bond pad connector by attaching the electronic component to, for each of the bond pads, at least a part of the extension component.

20 Claims, 10 Drawing Sheets

(56)　　　　　　　References Cited

U.S. PATENT DOCUMENTS

| 7,629,691 | B2 | | 12/2009 | Roush et al. | |
| 9,378,450 | B1 | * | 6/2016 | Mei | .................. G06K 19/07722 |
| 9,613,911 | B2 | | 4/2017 | Rogers et al. | |
| 10,264,673 | B2 | * | 4/2019 | Kanda | .................... H05K 1/181 |
| 10,609,816 | B2 | | 3/2020 | Yoo | |
| 2015/0325755 | A1 | | 11/2015 | Speer et al. | |
| 2016/0211473 | A1 | | 7/2016 | Van Den Ende et al. | |
| 2017/0181276 | A1 | | 6/2017 | Sawada et al. | |
| 2019/0156971 | A1 | | 5/2019 | Brink et al. | |
| 2023/0125282 | A1 | | 4/2023 | Ho et al. | |

* cited by examiner

BOND PAD CONNECTOR FOR SECURING AN ELECTRONIC COMPONENT THEREON

CROSS-REFERENCE TO RELATED APPLICATION

This application claims priority to Malaysian Utility Innovation Application No. UI2022005148, filed on Sep. 21, 2022.

FIELD

The disclosure relates to a bond pad connector for securing an electronic component thereon.

BACKGROUND

Currently, in the field of wearable technology, the application of surface mount device (SMD) plays an important role. Typically, the SMD may be used in different applications such as in a smart clothing system, and may be embedded in special fabrics (also known as electronic textiles, or e-textiles) via an interconnecting joint. The interconnecting joint may include bond pads disposed on the e-textiles.

It is noted that after being embedded in the e-textiles, the interconnecting joint may be subjected to a number of mechanical strains from different movements of the e-textiles such as bending, stretching, twisting, etc. Those movements are also known as axial movements. In the cases where one or more of the interconnecting joints that interconnect respective SMDs to the e-textiles are damaged due to the mechanical strains, the corresponding lifespans of the smart clothing system may be adversely affected.

SUMMARY

Therefore, one object of the disclosure is to provide a bond pad connector that is for securing an electronic component thereon, and that is configured to withstand the mechanical strains and therefore to have a better lifespan of usage.

According to one embodiment of the disclosure, a bond pad connector is disposed on a stretchable substrate and is adapted to secure an electronic component thereon. The bond pad connector includes two spaced apart bond pads that are adapted to be disposed on the stretchable substrate to face each other, each of the two bond pads is adapted to be connected to a respective conductive trace and includes: a stress relieve component that is adapted to be connected to the conductive trace, the stress relieve component being formed with a central hole, and an extension component extending from the stress relieve component and opposite to the conductive trace.

The electronic component is secured onto the bond pad connector by attaching the electronic component to, for each of the bond pads, a part of the stress relieve component and a part of the extension component.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
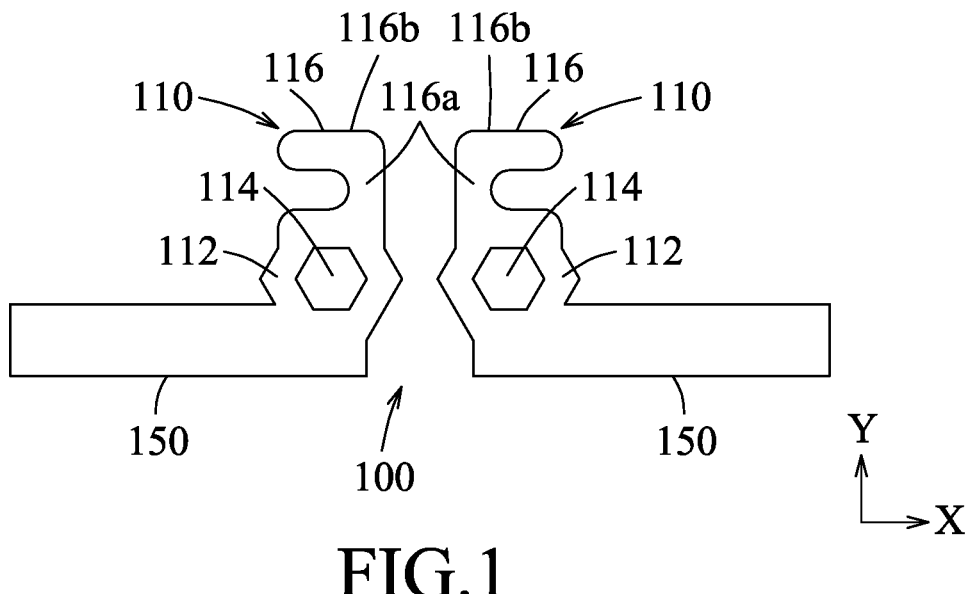
FIG. 1 is a top view of a bond pad connector according to one embodiment of the disclosure.
Figure 2:
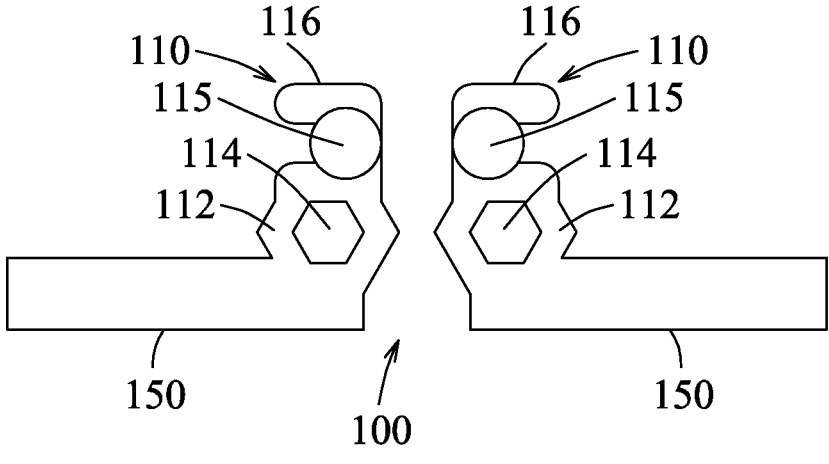
FIGS. 2 to 5 illustrate exemplary manners to dispose an interconnecting material on the bond pads.
Figure 3:
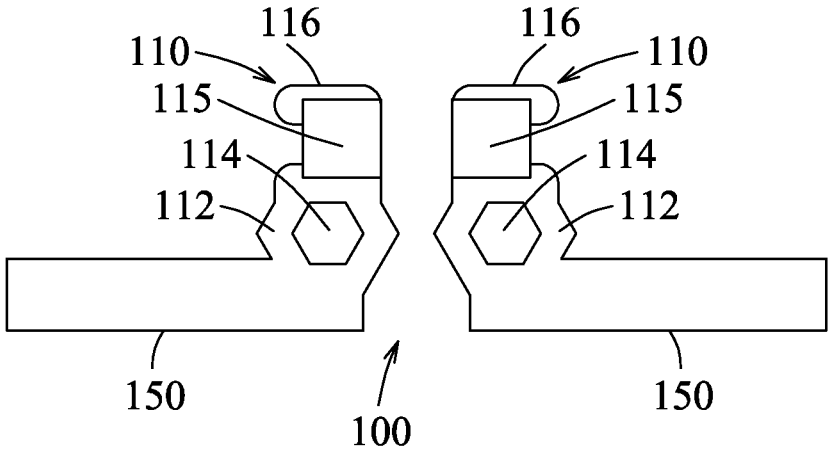
Figure 4:
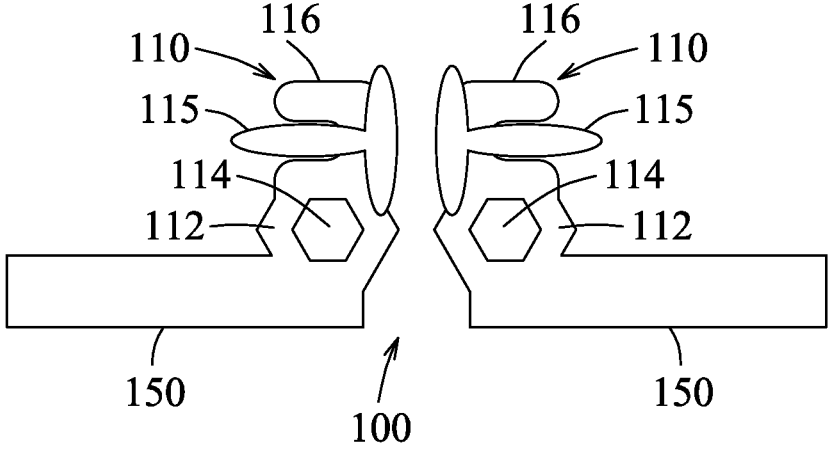
Figure 5:
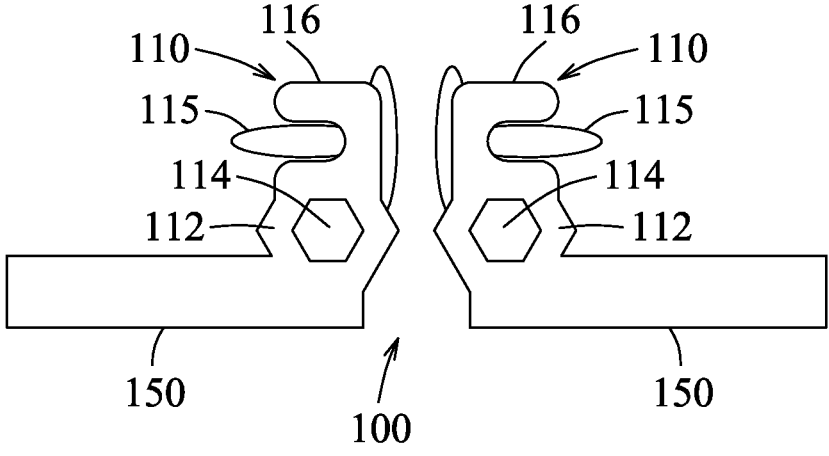

Before the disclosure is described in greater detail, it should be noted that where considered appropriate, reference numerals or terminal portions of reference numerals have been repeated among the figures to indicate corresponding or analogous elements, which may optionally have similar characteristics.

Throughout the disclosure, the term "coupled to" or "connected to" may refer to a direct connection among a plurality of electrical apparatus/devices/equipment via an electrically conductive material (e.g., an electrical wire), or an indirect connection between two electrical apparatus/devices/equipment via another one or more apparatus/devices/equipment, or wireless communication.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

FIG. 1 is a top view of a bond pad connector 100 according to one embodiment of the disclosure.

In this embodiment, the bond pad connector 100 is disposed on a stretchable substrate such as an electronic textile, and is adapted to secure an electronic component thereon. The electronic component secured on the bond pad connector 100 may be referred to as a surface mount device (SMD).

The bond pad connector 100 includes two spaced apart bond pads 110. Each of the bond pads 110 is connected to a respective conductive trace 150, and the two bond pads 110 are disposed to face each other. The bond pads 110 may be formed using an electrical conductive material (for example, solder paste, electrical conductive adhesive, any electrically conductive interconnect material or a material same as the conductive trace 150).

Each of the bond pads 110 includes a stress relieve component 112 that is connected to the conductive trace 150, and an extension component 116 that extends from the stress relieve component 112 and that is opposite to the conductive trace 150.

The conductive traces 150 respectively connected to the bond pads 110 are disposed on a stretchable substrate (not shown), in a printed circuit pattern, for electrically connecting a number of electronic components. In the embodiment of FIG. 1, the conductive traces 150 are disposed to extend along an X direction.

In the embodiment of FIG. 1, for each of the bond pads 110, the stress relieve component 112 is noncollinear with the respective conductive trace 150, and is formed with a central hole 114. In this configuration, the central hole 114 has a shape of a hexagon, and an outer contour of the stress relieve component 112 has a shape that is similar to a hexagon.

The extension component 116 includes a first portion 116a that extends upwardly from the stress relieve component 112 along a Y direction that is perpendicular to the X direction, and a second portion 116b that extends from an end of the first portion 116a opposite to the stress relieve component 112 along the X direction. It is noted that the second portions 116b of the bond pads 110 extend in opposite directions, respectively. In this embodiment, each of the bond pads 110 has a shape similar to the number "6," and the bond pad connector 100 has reflectional symmetry.

The bond pad connector 100 is adapted to be able to secure an electronic component thereon. In some embodiments, the electronic component may be a surface-mount technology (SMT) component. In practice, an interconnecting material 115 (e.g., an electrically conductive adhesive material or a non-conductive adhesive material (NCA)) may be disposed on each of the bond pads 110.

It is noted that the design of the extension components 116 provides the function of allowing the interconnecting material 115 to be disposed thereon. That is to say, in embodiments, the interconnecting material 115 is disposed on the extension component 116 of each of the bond pads 110. A part of the electronic component may be secured onto each of the extension components 116 via the interconnecting material 115, and may therefore be seen as a part of footprint associated with the electronic component.

FIGS. 2 to 5 illustrate exemplary manners (circular shapes, rectangular shapes, and T-shapes) to dispose the interconnecting material 115 on the bond pads 110.

Figure 6:
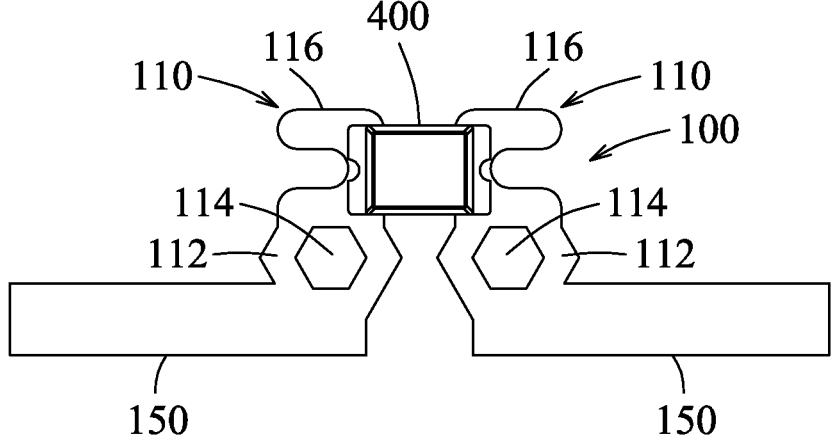
FIGS. 6 to 8 illustrate exemplary manners in which an electronic component is secured on the bond pad connector according to embodiments of the disclosure.
Figure 7:
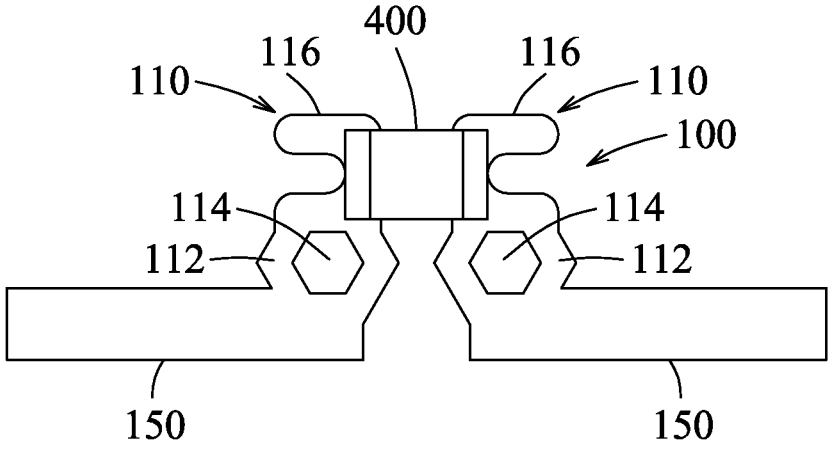
Figure 8:
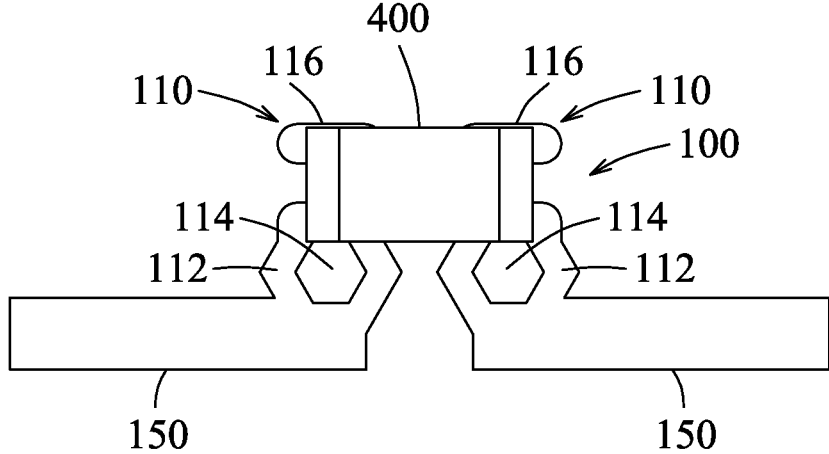

In practice, the interconnecting material 115 may first be disposed on the stretchable substrate, then the bond pad connector 100 is disposed over the interconnecting material 115 (as seen in FIGS. 6, 7, and 8). Alternatively, the bond pad connector 100 may first be disposed on the stretchable substrate, then the interconnecting material 115 is disposed over the pad connector 100.

FIGS. 6 to 8 illustrate exemplary manners in which an electronic component 400 is secured on the bond pad connector 100 according to embodiments of the disclosure. Specifically, the electronic component 400 is secured onto the bond pad connector 100 by attaching the electronic component 400 to, for each of the bond pads 110, a part of the extension component 116. It is noted that in some alternative examples, the electronic component 400 may be secured onto the bond pad connector 100 by attaching the electronic component 400 to, for each of the bond pads 110, a part of the stress relieve component 112 and a part of the extension component 116.

In this manner, the structure of the electronic component 400 secured on the bond pad connector 100 over the stretchable substrate may be more resilient to forces applied to the stretchable substrate. Therefore, a joint between the electronic component 400 and the bond pad connector 100 (i.e., where the electronic component 400 is attached to the bond pad connector 100 by the interconnecting material 115) is subjected to relatively less force.

In practice, the stretchable substrate may be subjected to a number of mechanical strains from different movements such as bending, stretching, twisting, pushing, etc. Those movements are also known as axial movements.

It is noted that, when the mechanical strains are applied to the stretchable substrate, the stress relieve component 112 having the central hole 114 may be deformed to reduce the stress experienced by the bond pad connector 100. That is to say, the stress relieve component 112 may act as a component similar to a spring to "absorb" some of the strains experienced by the bond pad connector 100.

The Finite Element Analysis (FEA) simulation developed by Ansys Inc. has been used to determine a stress experienced by the bond pad connector 100 as described in FIG. 1 when a given mechanical strain is applied to the stretchable substrate, compared with a conventional bond pad connector. A result of the FEA simulation indicates that the stress experienced by the bond pad connector 100 on the parts where the interconnecting material 115 is disposed are significantly lower than the stress experienced by the corresponding parts of the conventional bond pad connector.

Figure 9:
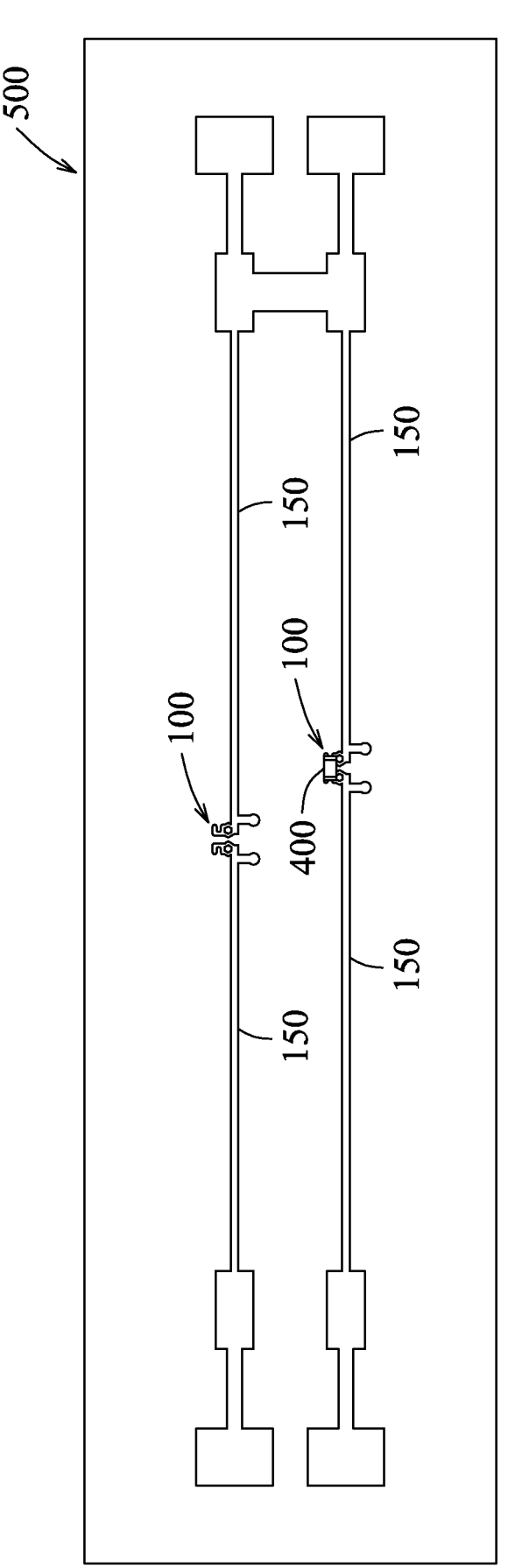
FIG. 9 illustrates an exemplary stretchable substrate with a printed circuit pattern, the bond pad connector connected to conductive traces, and the electronic component secured on the bond pad connector according to one embodiment of the disclosure.

FIG. 9 illustrates an exemplary stretchable substrate 500 with the printed circuit pattern (including the conductive traces 150), the bond pad connector 100 connected to the conductive traces 150, and the electronic component 400 secured on the bond pad connector 100 according to one embodiment of the disclosure.

Figure 10:
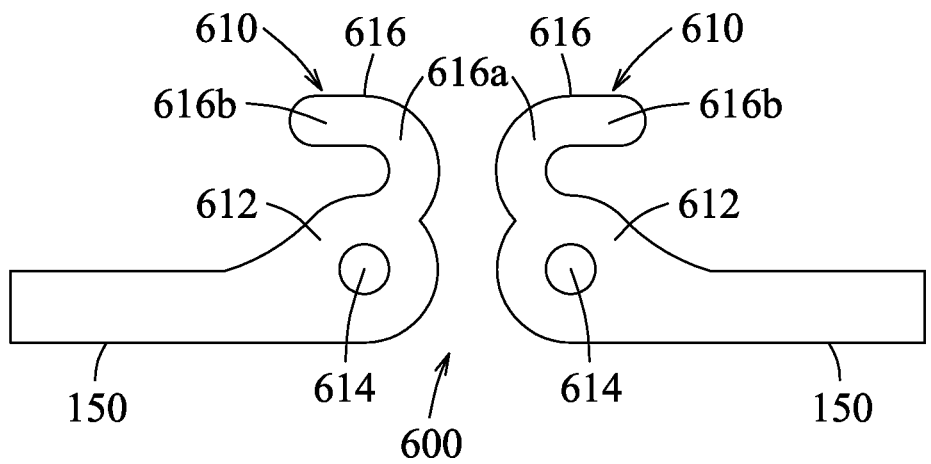
FIG. 10 is a top view of a bond pad connector according to one embodiment of the disclosure.

FIG. 10 is a top view of a bond pad connector 600 according to one embodiment of the disclosure.

In this embodiment, the bond pad connector 600 includes two spaced apart bond pads 610. Each of the bond pads 610 is connected to a respective conductive trace 150, and the two bonds pads 610 are disposed to face each other.

Each of the bond pads 610 includes a stress relieve component 612 that is connected to the conductive trace 150, and an extension component 616 that extends from the stress relieve component 612 and that is opposite to the conductive trace 150.

In the embodiment of FIG. 10, for each of the bond pads 610, the stress relieve component 612 is noncollinear with the conductive trace 150, and is formed with a central hole 614. In this configuration, the central hole 614 has a shape of a circle, and an outer contour of the stress relieve component 612 has a shape that is similar to a circle.

The extension component 616 includes a first portion 616a that extends curvedly and upwardly along the direction Y from the stress relieve component 612, and a second portion 616b that extends from an end of the first portion 616a opposite to the stress relieve component 612 along the direction X. It is noted that, the second portions 616b respectively of the bond pads 610 extend in opposite directions. In this embodiment, each of the bond pads 610 has a shape similar to the number "6," and the bond pad connector 600 has reflectional symmetry.

Figure 11:
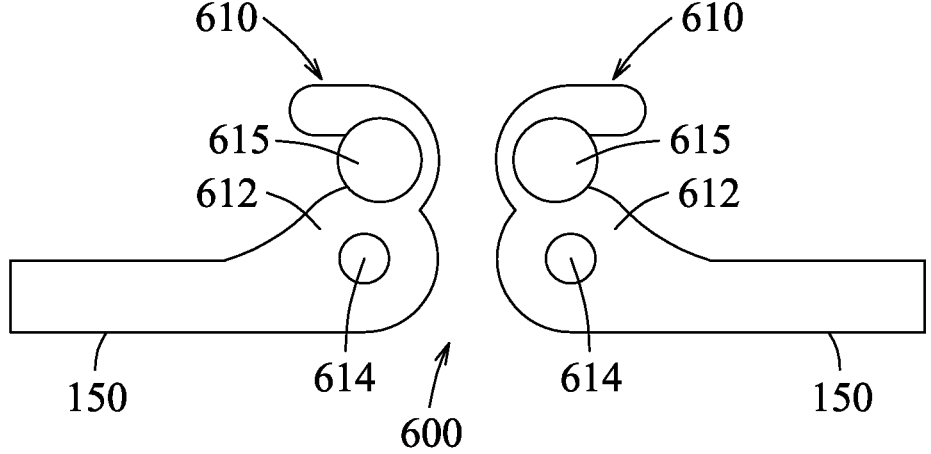
FIGS. 11 to 13 illustrate exemplary manners to dispose an interconnecting material on the bond pads.
Figure 12:
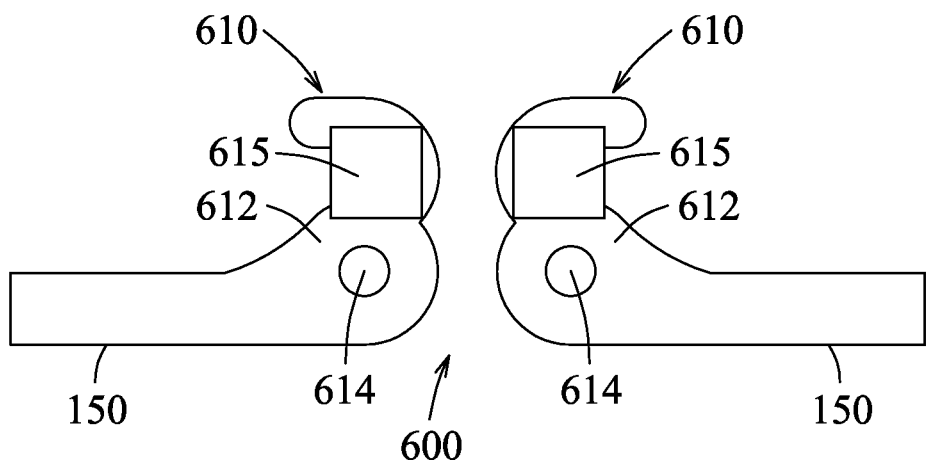
Figure 13:
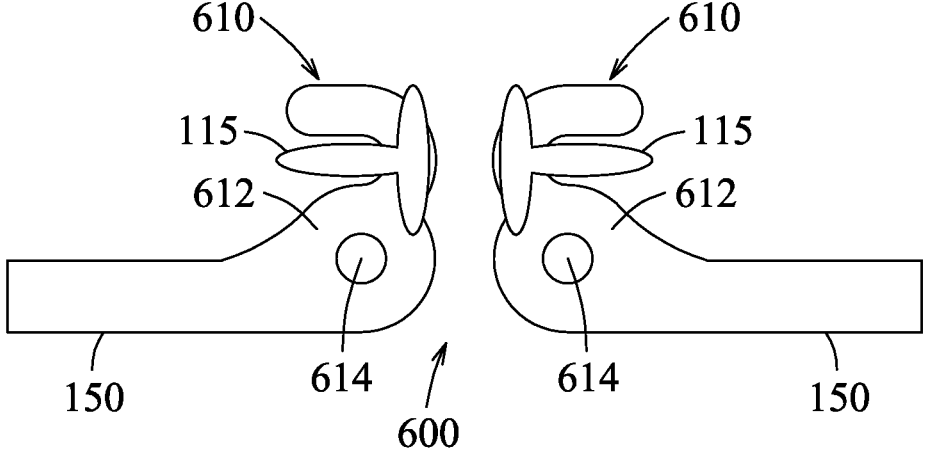

FIGS. 11 to 13 illustrate exemplary manners (circular shapes, rectangular shapes, and T-shapes, respectively) to dispose an interconnecting material 615 on the bond pads 610.

It is noted that the design of the extension components 616 provides the function of allowing the interconnecting material 615 to be disposed thereon. That is to say, a part of the electronic component may be secured onto each of the extension components 616 via the interconnecting material 615, and may therefore be seen as a part of footprint associated with the electronic component.

In practice, the interconnecting material 615 may first be disposed on the stretchable substrate, then the bond pad connector 600 is disposed over the interconnecting material 615. Alternatively, the bond pad connector 600 may first be disposed on the stretchable substrate, then the interconnecting material 615 is disposed over the pad connector 600.

Figure 14:
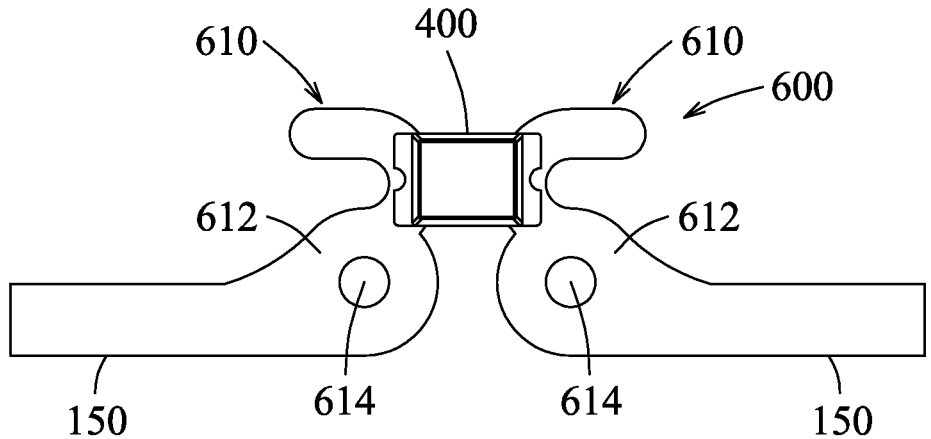
FIGS. 14 to 16 illustrate exemplary manners in which the electronic component is secured on a bond pad connector according to one embodiment of the disclosure.
Figure 15:
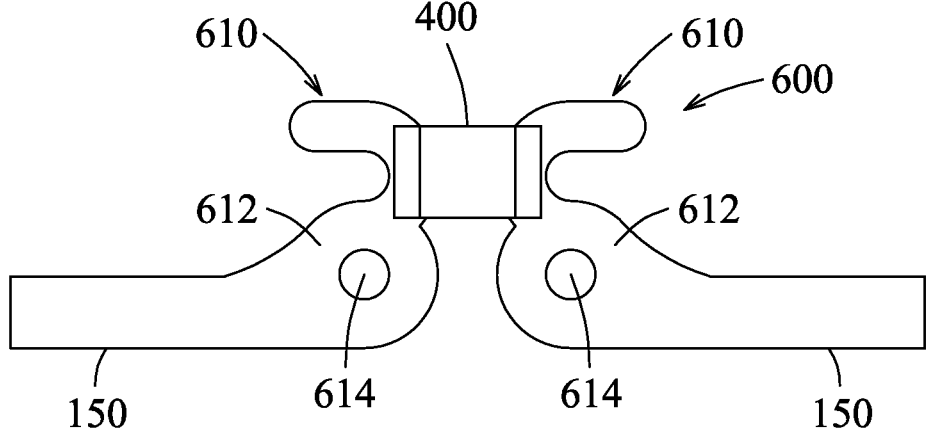
Figure 16:
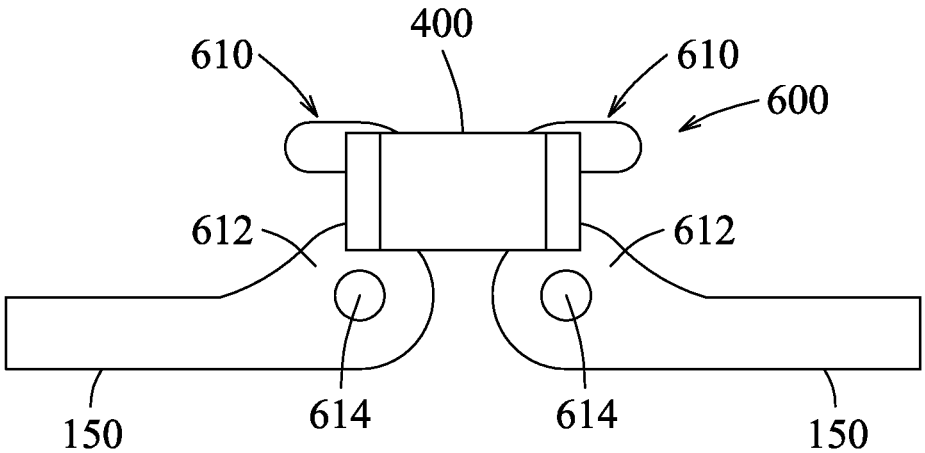

FIGS. 14 to 16 illustrate exemplary manners in which the electronic component 400 is secured on the bond pad connector 600 according to one embodiment of the disclosure. Specifically, the electronic component 400 is secured onto the bond pad connector 600 by attaching the electronic component 400 to, for each of the bond pads 610, a part of the extension component 616. It is noted that in some alternative examples, the electronic component 400 may be secured onto the bond pad connector 600 by attaching the electronic component 400 to, for each of the bond pads 610, a part of the stress relieve component 612 and a part of the extension component 616. That is to say, in various embodiments, the electronic component 400 may be secured onto the bond pad connector 600 by attaching the electronic component 400 to, for each of the bond pads 610, at least a part of the extension component 616.

In this manner, the structure of the electronic component 400 secured on the bond pad connector 600 over the stretchable substrate may be more resilient to forces applied to the stretchable substrate. Therefore, a joint between the electronic component 400 and the bond pad connector 600 (i.e., where the electronic component 400 is attached to the bond pad connector 600 by the interconnecting material 615) is subjected to relatively less force.

The FEA simulation has been used to determine a stress experienced by the bond pad connector 600 as described in FIG. 6 when a given mechanical strain is applied to the stretchable substrate 500, compared with a conventional bond pad connector. A result of the FEA simulation indicates that the stress experienced by the bond pad connector 600 on the parts where the interconnecting material is disposed are significantly lower than the stress experienced by the corresponding parts of the conventional bond pad connector.

It is noted that other similar shapes of the bond pad connector may also achieve the effects as described above.

Figure 17:
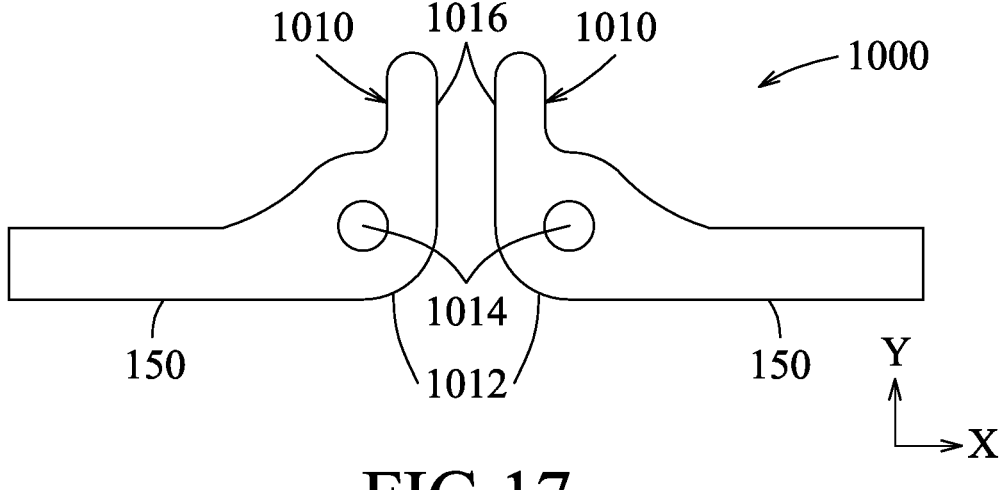
FIG. 17 is a top view of a bond pad connector according to one embodiment of the disclosure.

FIG. 17 is a top view of a bond pad connector 1000 according to one embodiment of the disclosure.

In this embodiment, the bond pad connector 1000 includes two spaced apart bond pads 1010. Each of the bond pads 1010 is connected to a respective conductive trace 150, and the two bond pads 1010 are disposed to face each other.

Each of the bond pads 1010 includes a stress relieve component 1012 that is connected to the conductive trace 150, and an extension component 1016 that extends from the stress relieve component 1012 and that is opposite to the conductive trace 150. The stress relieve component 1012 is formed with a central hole 1014.

The bond pad connector 1000 differs from the bond pad connector 600 in the extension component 1016 of each of the bond pads 1010, which extends straight and upwardly from the stress relieve component 1012 along the direction Y. In this embodiment, the bond pads 1010 have shapes that are similar to the letters "d" and "b," respectively.

In alternative embodiments, the extension component 1016 of each of the bond pads 1010 may extend straight and downwardly from the stress relieve component 1012 along the direction Y, resulting in the bond pads 1010 with shapes that are similar to the letters "q" and "p," respectively.

Figure 18:
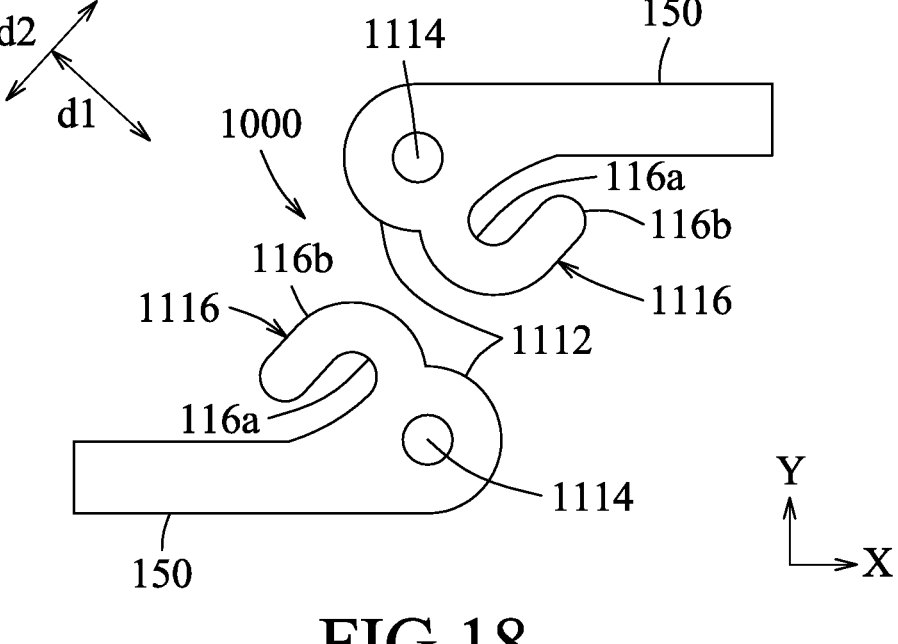
FIG. 18 is a top view of a bond pad connector according to one embodiment of the disclosure.

FIG. 18 is a top view of a bond pad connector 1100 according to one embodiment of the disclosure.

In this embodiment, the bond pad connector 1100 includes two spaced apart bond pads 1110. Each of the bond pads 1110 is connected to a respective conductive trace 150, and the two bond pads 1110 are disposed to face each other.

Each of the bond pads 1110 includes a stress relieve component 1112 that is connected to the conductive trace 150 and an extension component 1116 extending from the stress relieve component 1112. The stress relieve component 1112 is formed with a central hole 1114.

The bond pad connector 1100 of this embodiment is configured to be used with two conductive traces 150 that are noncollinear and parallel with each other. In this embodiment, the extension component 1116 includes a first portion 1116_a_ that curvedly extends from the stress relieve component 1112 and that is opposite to the conductive trace 150, and a second portion 1116_b_ that extends from an end of the first portion 1116_a_ along a direction toward the conductive trace 150. An angle formed between an extension line of the first portion 1116_a_ and the corresponding conductive trace 150 may be about 45 degrees.

It is noted that, the second portions 1116_b_ respectively of the bond pads 1110 extend in opposite directions. Additionally, in this embodiment, an electronic component may be secured onto the bond pad connector 1100 in a manner that a longitudinal direction of the electronic component is parallel to an extension direction of the second portion 1116_b_.

Results of the FEA simulation also indicate that the stress experienced by the bond pad connectors 1000, 1100 on the parts where the interconnecting material is disposed is significantly lower than the stress experienced by the corresponding parts of the conventional bond pad connector.

According to the results of the FEA simulation, in different embodiments of the disclosure, the stress experienced by an extension component may be 24% to 98% less compared to the stress experienced by the corresponding part of the conventional bond pad connector, and the stress experienced by a stress relieve component may be 86% to 99.8% less compared to the stress experienced by the corresponding part of the conventional bond pad connector. Additionally, the stress experienced by each of the conductive traces 150 is also reduced when connected to the bond pad connectors as described in the embodiments of the disclosure.

In summary, the disclosure provides various embodiments of a bond pad connector that is adapted for securing an electronic component thereon. Since the bond pad connector itself is disposed on a stretchable substrate, the bond pad connector is capable of securing the electronic component on the stretchable substrate. The bond pad connector includes two spaced-apart bond pads, and each of the bond pads has a stress relieve component that is formed with a central hole and an extension component extended from the stress relieve component for disposing the interconnecting material thereon (and therefore securing the electronic component). Using the design of the bond pad connector as described in the embodiments to secure the electronic component on the stretchable substrate, the actual stress experienced by the parts of the bond pad connector attached to the electronic component may be reduced when the stretchable substrate is subjected to external mechanical strains from different movements of the e-textiles such as bending, stretching, twisting, pushing, etc. Therefore, potential negative effects due to the external mechanical strains, such as the joint between the electronic component and the conductive trace becoming a loose contact, or the electronic component becoming detached from the stretchable substrate, may be reduced. This design may be particularly useful in applications such as printed electronics, stretchable electronics, e-textile, wearable electronic, etc.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, the one or more features may be singled out and practiced alone without the another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A bond pad connector comprising:
two spaced apart bond pads, each of the two spaced apart bond pads configured to connect to a respective conductive trace, and each of two spaced apart bond pads including:
a stress relieve component that is adapted to be connected to the conductive trace, the stress relieve component being formed with a central hole; and
an extension component extending from the stress relieve component and opposite to the conductive trace,
wherein the two spaced apart bond pads face each other on a stretchable substrate, and
wherein an electronic component is secured onto the bond pad connector by attaching the electronic component to, for each of the two spaced apart bond pads, at least a part of the extension component.

2. The bond pad connector as claimed in claim 1, wherein, each of the two spaced apart bond pads further includes an interconnecting material disposed on the extension component of each of the two spaced apart bond pads, and a part of the electronic component is secured onto each of the extension components via the interconnecting material.

3. The bond pad connector as claimed in claim 1, wherein the electronic component is secured onto the bond pad connector by attaching the electronic component to, for each of the two spaced bond pads, a part of the stress relieve component and a part of the extension component.

4. The bond pad connector as claimed in claim 1, the conductive traces being disposed to extend along an X direction, wherein, for each of the two spaced bond pads:
the stress relieve component is noncollinear with the respective conductive trace;
the extension component includes a first portion that extends upwardly from the stress relieve component along a Y direction that is perpendicular to the X direction, and a second portion that extends from an end of the first portion opposite to the stress relieve component along the X direction; and
the second portions of the two spaced bond pads extend in opposite directions, respectively.

5. The bond pad connector as claimed in claim 4, wherein the first portion extends curvedly from the stress relieve component.

6. The bond pad connector as claimed in claim 1, the conductive traces being disposed to extend along an X direction, wherein, for each of the two spaced bond pads, a first portion extends straightly and upwardly from the stress relieve component along a Y direction that is perpendicular to the X direction.

7. The bond pad connector as claimed in claim 1, the conductive traces being disposed to extend along an X direction, wherein, for each of the two spaced bond pads, a first portion extends straightly and downwardly from the stress relieve component along a Y direction that is perpendicular to the X direction.

8. The bond pad connector as claimed in claim 1, being configured to be used with two conductive traces that are noncollinear and parallel with each other, wherein, for each of the two spaced bond pads:
the extension component includes a first portion that curvedly extends from the stress relieve component and that is opposite to the conductive trace, and a second portion that extends from an end of the first portion along a direction toward the conductive trace.

9. The bond pad connector as claimed in claim 8, wherein an angle is formed between an extension line of the first portion and a corresponding conductive trace.

10. The bond pad connector as claimed in claim 9, wherein the angle is about 45 degrees.

11. A bond pad connector to be disposed on a stretchable substrate and adapted to secure an electronic component thereon, the bond pad connector comprising:
two spaced apart bond pads, each bond pad including:
a stress relieve component, wherein an outer contour of the stress relieve component has a shape similar to a circle; and
an extension component extending from the stress relieve component,
wherein the two spaced apart bond pads face each other on a stretchable substrate,
wherein each of the two spaced apart bond pads being adapted to be connected to a respective conductive trace, and
wherein an electronic component is secured onto the bond pad connector by attaching the electronic component to, for each of the two spaced apart bond pads, at least a part of the extension component.

12. The bond pad connector as claimed in claim 11, wherein, each of the two spaced apart bond pads further includes an interconnecting material disposed on the extension component of each of the two spaced apart bond pads, and a part of the electronic component is secured onto each of the extension components via the interconnecting material, the extension component is opposite to the conductive trace.

13. The bond pad connector as claimed in claim 11, wherein the electronic component is secured onto the bond pad connector by attaching the electronic component to, for each of the two spaced apart bond pads, a part of the stress relieve component and a part of the extension component.

14. The bond pad connector as claimed in claim 11, the stress relieve component is adapted to be connected to the conductive trace, the conductive traces being disposed to extend along an X direction, wherein, for each of the two spaced apart bond pads:

the stress relieve component is noncollinear with the respective conductive trace;
   the extension component includes a first portion that extends upwardly from the stress relieve component along a Y direction that is perpendicular to the X direction, and a second portion that extends from an end of the first portion opposite to the stress relieve component along the X direction; and
   the second portions of the two spaced apart bond pads extend in opposite directions, respectively.

15. The bond pad connector as claimed in claim 14, wherein the first portion extends curvedly from the stress relieve component.

16. The bond pad connector as claimed in claim 11, the conductive traces being disposed to extend along an X direction, wherein, for each of the two spaced apart bond pads, a first portion extends straightly and upwardly from the stress relieve component along a Y direction that is perpendicular to the X direction.

17. The bond pad connector as claimed in claim 11, the conductive traces being disposed to extend along an X direction, wherein, for each of the two spaced apart bond pads, a first portion extends straightly and downwardly from the stress relieve component along a Y direction that is perpendicular to the X direction.

18. The bond pad connector as claimed in claim 11, being configured to be used with two conductive traces that are noncollinear and parallel with each other, wherein, for each of the two spaced apart bond pads:

the extension component includes a first portion that curvedly extends from the stress relieve component and that is opposite to the conductive trace, and a second portion that extends from an end of the first portion along a direction toward the conductive trace.

19. The bond pad connector as claimed in claim 18, wherein an angle is formed between an extension line of the first portion and a corresponding conductive trace.

20. The bond pad connector as claimed in claim 19, wherein the angle is about 45 degrees, and the stress relieve component is formed with a central hole.

\* \* \* \* \*